Sept. 1, 1964 J. S. DE METRICK 3,147,453

TUNER INDUCTOR HAVING RIDGED STRIP TERMINAL LEAD
ADAPTED FOR CONNECTION TO PRINTED CIRCUIT

Filed Feb. 15, 1963

INVENTOR.
John S. DeMetrick
BY
Ezekiel Wolf, Wolf + Greenfield
ATTORNEYS 3,147,453

TUNER INDUCTOR HAVING RIDGED STRIP TERMINAL LEAD ADAPTED FOR CONNECTION TO PRINTED CIRCUIT

John S. De Metrick, Lexington, Mass., assignor to Automatic Radio Mfg. Co., Inc., Boston, Mass., a corporation of Massachusetts Filed Feb. 15, 1963, Ser. No. 258,737
5 Claims. (Cl. 334—74)

The present invention relates in general to high frequency electrical tuning and more particularly concerns a novel tunable inductor assembly especially suitable for use in very high frequency radio tuners, such as those used for reception in the FM band. The assembly of the present invention is characterized by excellent electrical properties and the ability to withstand considerable mechanical shock with little effect on the electrical properties of the tuning network. The invention is especially advantageous when producing a large number of high frequency tuners because electrical properties are relatively easy to duplicate from unit to unit. Where slight corrections are required, the corrections may be made with a relatively simple adjustment.

Most very high frequency continuous turners, such as used for most home FM radios, employ ganged tuning capacitors for selecting the different stations while maintaining RF and oscillator tuned circuits tuned to respective signal and local oscillator frequencies having a difference corresponding to the I-F frequency of the particular receiver. One of the most difficult aspects of a very high frequency tuner is to establish accurate tracking over the band. That is, the difference in frequency between the resonant point of the R-F tuned circuit and the local oscillator tuned circuit should differ by the intermediate frequency over the tuning band.

One important cause of difficulties in maintaining good tracking is a result of variations in inductance. A typical technique for adjusting the inductance to establish proper tracking involves compressing and expanding the turns of an air-core coil. However, effecting precise small changes in inductance is difficult to achieve without a number of adjustments.

It is an important object of the present invention to providing a tuning assembly having a tuning inductor whose prescribed electrical properties are relatively easy to achieve on a production basis with relatively unskilled production workers while still providing a high degree of electrical performance.

It is still another object of the invention to achieve the preceding object while maintaining the tuning assembly relatively insensitive to mechanical shocks.

It is still another object of the invention to provide means for selectively varying the electrical properties of the inductor to electrically tune over a prescribed frequency range.

It is still another object of the invention to achieve the preceding objects with a plurality of such inductors so that the tuning properties of the inductors track together over a prescribed frequency range.

According to the invention, the inductor has a conducting strip with the width of the strip much greater than its thickness. The strip has an inside portion looped about an axis and joined to respective end portions which are formed with a longitudinal rib for most of their length. An insulating base includes conducting means defining at least a pair of eyelets defining a perimeter larger than the cross section of each end portion when an end portion resides in the eyelet. Means are provided for supporting the inductor in fixed relationship with respect to the insulating base. Means mechanically and electrically connect each of the end portions in respective ones of the eyelets to establish a selected fixed length between each eyelet and the inside portion. Electrical conducting leads of fixed length function for establishing electrical contact with a capacitor. The capacitor and inductor comprising a resonant electrical circuit.

An additional feature of the invention resides in crimping the end portions. This crimping seems to help the assembly withstand mechanical shock without producing electrical changes while making it easier for an assembly worker to establish a fixed value of inductance by controlling the length of the end portion between the crimp and the eyelet.

Numerous other features, objects and advantages of the invention will become apparent from the following specification when read in connection with the accompanying drawing in which.

Figure 1:
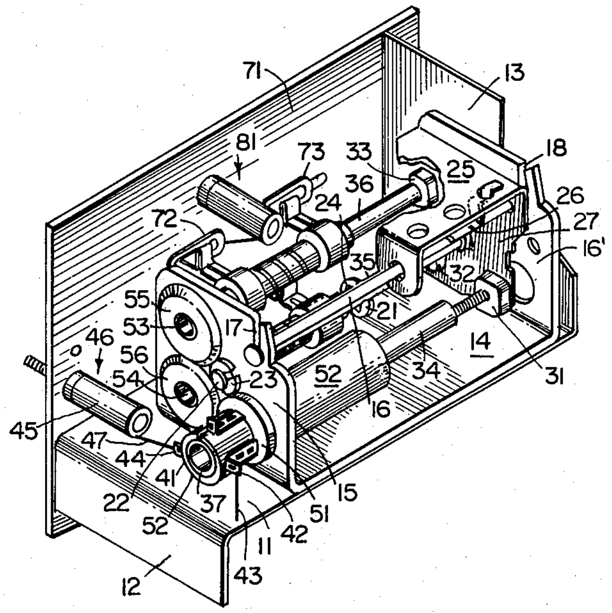
FIG. 1 is a perspective view of a tuning assembly according to the invention as assembled in an actual FM tuner with various circuit components and connections in the complete tuner not shown so as not to obscure the principles of the invention.

With reference now to the drawing and more particularly FIG. 1 thereof, there is shown a perspective view of a tuning assembly according to the invention actually incorporated into an FM tuner. A number of components in the completed tuner have been omitted so as not to obscure the principles of this invention. The assembly comprises a chassis plate 11 having a downwardly extending front plate 12 and an upwardly extending back plate 13. The chassis 11 supports a U-shaped coil assembly supporting bracket 14 having a front plate 15 and a back plate 16'. An upper rod 16 is formed with angular grooves which mate with the vertical grooves 17 and 18 in front plate 15 and back plate 16, respectively, in a force fit. A central rod 21 may be formed with an end stud 22 formed with an angular groove for accommodating the resilient split ring 23 to coact with the angular shoulder of rod 21 on the other side of front plate 15 and keep rod 21 in place. Rod 21 is also formed with an annular groove for accommodating another resilient split ring 24 which functions as a stop to limit the forward travel of the J-shaped movable slug base 25.

Slug support base 25 is formed with two openings in the legs of its bight which surround and ride on upper rod 16, a spring 26 attached to the slug base 25 riding on rod 16 to help keep slug base 25 in a selected position. The back leg 27 of slug support base 25 carries internally threaded plastic grommets 31, 32 and 33 for receiving the threaded stems of antenna slug 34, oscillator slug 35 and R-F slug 36, respectively.

Antenna coil 37 is conventional and may include a tap terminal 41 for receiving the signal from the antenna, a ground terminal 42 connected to the chassis ground 11 by lead 43 and a terminal 44 connected to the outside conductor 45 of the coaxial trimming capacitor 46 by the conducting lead 47. Coil 37 is supported in front base plate 15 by means including the grommet 51. The supported coil helps support antenna slug 34 as it slides through coil 37 during tuning. A shield 52 surrounds the antenna coil 37 and is preferably soldered to plate 15.

R-F coil 53 and oscillator coil 54 are supported in front base 15 by means including grommets 55 and 56, respectively. Coils 53 and 54 help support R-F slug 36 and oscillator slug 35, respectively, as slug base 25 moves back and forth in effecting tuning of the assembly.

Figure 3:
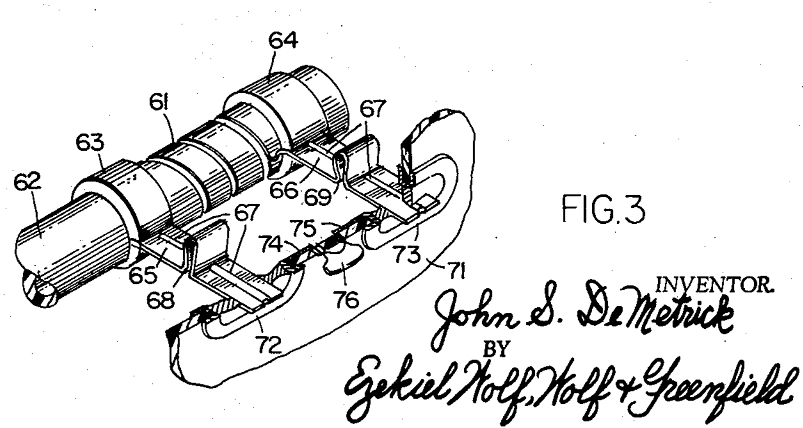
FIG. 3 is an enlarged detailed view illustrating the relationship between an inductor and the eyelets in the insulating base.

Coils 53 and 54 are of similar construction as is best seen in FIG. 3. Each comprises a flat conducting strip having a central portion 61 wound about the coil form 62 with split rings 63 and 64 of insulating material embracing the end turns of the central portion 61 and having the split in the rings 63 and 64 immediately adjacent to the end portions 65 and 66. These end portions are formed with ribs 67 in the flat portions separated by crimps 68 and 69 as shown.

The insulating base 71, which may be a printed circuit board for accommodating additional circuit components and interconnecting these components, is formed with conducting eyelets like 72 and 73 for receiving the ends of end portions 65 and 66, solder mechanically and electrically connecting these ends to the eyelets.

Eyelets 72 and 73 are connected to conducting leads 74 and 75 of fixed lengths, preferably conducting strips printed on the board, for connection to a capacitor, like the disc capacitor 76, whose leads pass through openings in the insulating base.

Figure 2:
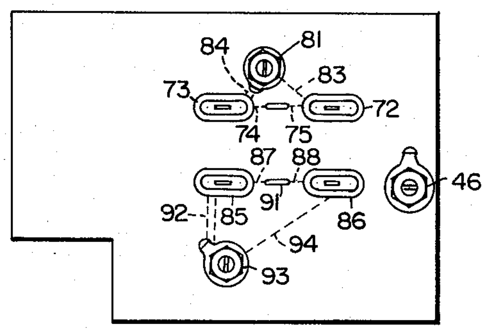
FIG. 2 is a plan view of the insulating base printed circuit board showing the eyelets but omitting numerous components not necessary for understanding the invention.

An R-F coaxial trimmer capacitor 81 has its outside conductor 82 connected to eyelet 72 by means of lead 83 of fixed length and its inside conductor lead connected to eyelet 73 by a short length of conducting strip 84, preferably printed on the printed circuit board, its location being best understood by the broken line in FIG. 2.

Oscillator coil 54 is similarly oriented with its end portions soldered to eyelets 85 and 86 to which fixed leads 87 and 88, similar to leads 74 and 75, connect-shunt disc capacitor 91 to conducting eyelets 85 and 86. A flat conducting strip lead of fixed length 92 connects conducting eyelet 85 to the inside conducting plate of coaxial capacitor 93. Lead 94, of fixed length, connects the outside conducting plate of that capacitor to eyelet 86.

Actual production experience has demonstrated that satisfactory tracking is obtained merely by making the length of the end portions 65 and 66 the same from unit-to-unit and soldering these end strips in the eyelets.

It has also been found sufficient to set the slugs 34, 35 and 36 at a prescribed distance away from the back leg 27 of slug support 25, position the slug assembly 25 with that plate 27 in contact with that plate 13 and adjust the coaxial capacitors 46, 81 and 93 to resonate inductors 53 and 37 at the R-F frequency at the high end of the tuner band while resonating inductor 54 at a frequency above that R-F frequency by a frequency difference corresponding to the intermediate frequency of the associated receiver.

To maximize tracking, slug support base 25 may be moved so that back leg 27 rests against the split ring stop 24 and the slugs adjusted by turning screws exposed through openings in back leg 27 and back plate 13 to resonate coils 53 and 37 at the R-F frequency at the low end of the tuner range while resonating inductor 54 at a frequency above that low end frequency by a frequency difference corresponding to the intermediate frequency of the associated receiver.

The longitudinal rib in the flat portions of end portions 65 and 66 help strengthen these leads while the crimped portions 68 and 69 seem to function as shock absorbers which allow the assembly to stand considerable shock without affecting the electrical properties of the inductors.

There has been described a novel tuning assembly characterized by compactness, good tracking properties, good electrical properties, ease of assembly, ease of alignment, ease of duplication of electrical characteristics, ability to withstand severe mechanical shock and at relatively low cost. For a representative electrical circuit diagram of an FM tuner incorporating the invention, reference is made to the schematic circuit diagram accompanying the commercially available Automatic Radio Type CFM-2 AM-FM fully transistorized radio receiver.

It is evident that those skilled in the art may now make numerous modifications of and departures from the specific embodiment described herein without departing from the inventive concepts. Consequently, the invention is to be construed as limited only by the sphere and the scope of the appended claims.

What is claimed is:

1. A high frequency electrical tuning assembly comprising, an inductor having a conducting strip with the width of said strip much greater than its thickness, said strip having an inside portion looped about an axis joined to respective end portions which are formed with a longitudinal rib for most of their length, means defining an insulating base with conducting means defining at least a pair of eyelets formed therein defining a perimeter larger than the cross section of each end portion when an end portion resides in a said eyelet, means for supporting said inductor in fixed relationship with respect to said insulating base, means for mechanically and electrically connecting each of said end portions in respective ones of said eyelets to establish a selected fixed length between each eyelet and said inside portion, and electrical conducting leads of fixed length connected from said eyelets for establishing electrical contact with a tuning capacitor.

2. A high frequency electrical tuning assembly in accordance with claim 1 wherein each of said end portions is formed with a crimp.

3. A high frequency electrical tuning assembly in accordance with claim 1 and further comprising, means relatively movable with respect to said conducting strip for controlling the electrical properties of said inductor.

4. A high frequency electrical tuning assembly in accordance with claim 2 and further comprising, means relatively movable with respect to said conducting strip for controlling the electrical properties of said inductor.

5. A high frequency electrical tuning assembly in accordance with claim 3 and further comprising, a second of said inductors, conducting means defining a second pair of eyelets formed in said insulating base defining a perimeter larger than the cross section of each end portion of said second inductor conducting strip when such end portion resides in an eyelet of said second pair, means for supporting said second inductor in fixed relationship with respect to said insulating base, means for mechanically and electrically connecting each of said second inductor end portions in respective ones of said second pair eyelets to establish a selected fixed length between each second pair eyelet and said second inductor inside portion, electrical conducting leads of fixed length connected from said eyelets for establishing electrical contact with a capacitor, second means relatively movable with respect to said second inductor conducting strip for controlling the electrical properties of said second inductor, and means for maintaining said first and second means in fixed relationship to provide for simultaneous alteration of the electrical properties of said first and second inductors together.

No references cited.